US012787763B2

(12) United States Patent
Yamahira et al.

(10) Patent No.: US 12,787,763 B2
(45) Date of Patent: Nov. 3, 2026

(54) SEMICONDUCTOR MODULE AND POWER MODULE INCLUDING THE SAME

(71) Applicant: DENSO CORPORATION, Kariya-city (JP)

(72) Inventors: Yuu Yamahira, Kariya-city (JP); Masashi Masumoto, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 659 days.

(21) Appl. No.: 18/296,014

(22) Filed: Apr. 5, 2023

(65) Prior Publication Data

US 2023/0395458 A1 Dec. 7, 2023

Related U.S. Application Data

(63) Continuation of application No. PCT/JP2021/033908, filed on Sep. 15, 2021.

(30) Foreign Application Priority Data

Nov. 12, 2020 (JP) ................................ 2020-188867

(51) Int. Cl.

*H10W 40/22* (2026.01)
*H10D 8/00* (2025.01)
*H10D 84/00* (2025.01)
*H10W 40/47* (2026.01)

(52) U.S. Cl.

CPC ............ *H10W 40/22* (2026.01); *H10D 8/411* (2025.01); *H10D 84/144* (2025.01); *H10W 40/47* (2026.01)

(58) Field of Classification Search

CPC .... H10W 40/22; H10W 40/47; H10D 84/144; H10D 8/411
USPC .......................................................... 257/678
See application file for complete search history.

(56) References Cited

U.S. PATENT DOCUMENTS

2017/0301614 A1* 10/2017 Kimura ............. H01L 23/49568
2019/0355634 A1* 11/2019 Liu ....................... H01L 23/051
2019/0356227 A1* 11/2019 Davison ................ H02M 3/158

FOREIGN PATENT DOCUMENTS

JP 2007-305836 A 11/2007

* cited by examiner

*Primary Examiner* — Norman D Richards
*Assistant Examiner* — Colin Russell Mccutcheon
(74) *Attorney, Agent, or Firm* — Oliff PLC

(57) ABSTRACT

A first semiconductor component having a first semiconductor chip and a first heat sink and a second semiconductor component having a second semiconductor chip and a second heat sink are disposed in a cooler. The first semiconductor chip is smaller in size than the second semiconductor chip. A first heat conduction surface between the first semiconductor chip and the first heat sink is smaller in an area than a second heat conduction surface between the second semiconductor chip and the second heat sink. A first region of the cooler where the first semiconductor component is disposed has higher cooling performance than a second region of the cooler where the second semiconductor component is disposed.

18 Claims, 6 Drawing Sheets

SEMICONDUCTOR MODULE AND POWER MODULE INCLUDING THE SAME

CROSS REFERENCE TO RELATED APPLICATIONS

The present application is a continuation application of International Patent Application No. PCT/JP2021/033908 filed on Sep. 15, 2021, which designated the U.S. and claims the benefit of priority from Japanese Patent Application No. 2020-188867 filed on Nov. 12, 2020. The entire disclosures of all of the above applications are incorporated herein by reference.

TECHNICAL FIELD

The present disclosure relates to a semiconductor module and a power module including the same.

BACKGROUND

According to a conceivable technique, a power conversion circuit is known.

SUMMARY

According to an example, a first semiconductor component having a first semiconductor chip and a first heat sink and a second semiconductor component having a second semiconductor chip and a second heat sink may be disposed in a cooler. The first semiconductor chip may be smaller in size than the second semiconductor chip. A first heat conduction surface between the first semiconductor chip and the first heat sink may be smaller in an area than a second heat conduction surface between the second semiconductor chip and the second heat sink. A first region of the cooler where the first semiconductor component is disposed may have higher cooling performance than a second region of the cooler where the second semiconductor component is disposed.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
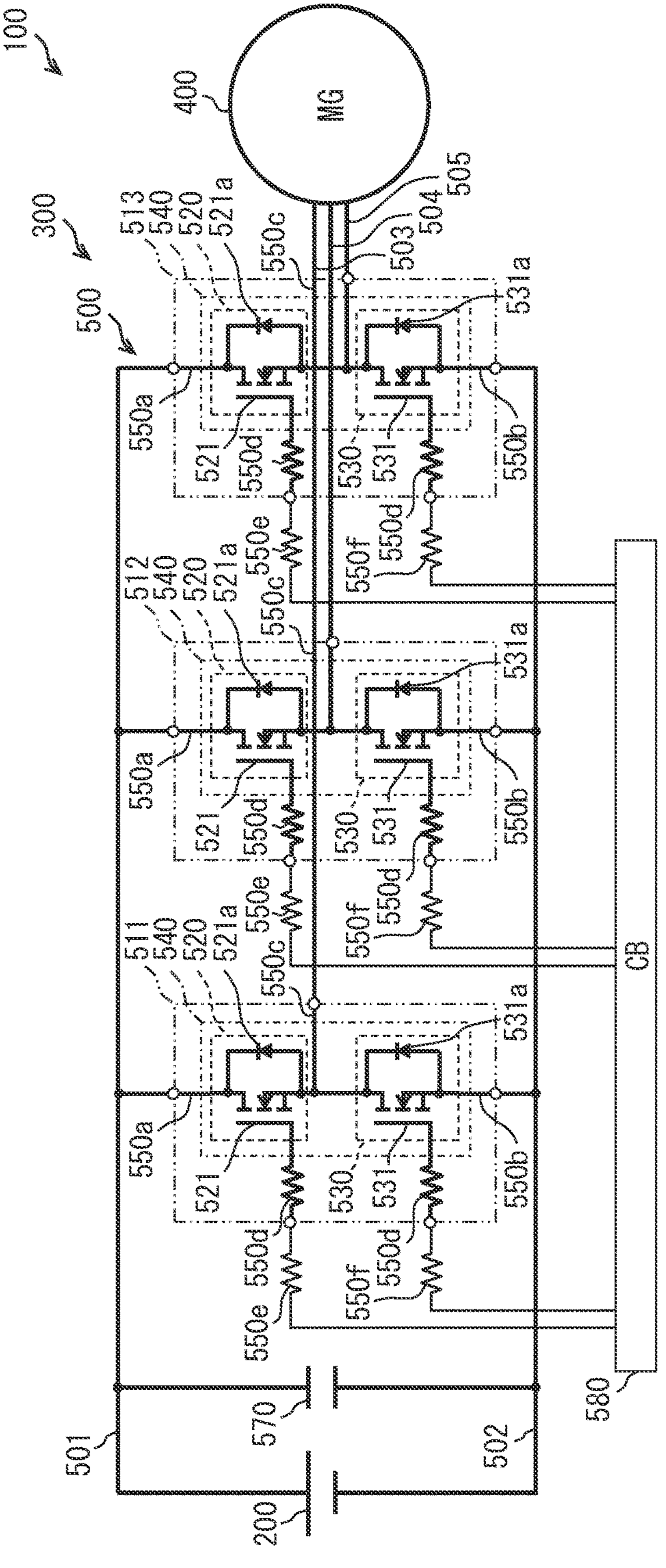
FIG. 1 is a circuit diagram illustrating an in-vehicle system.

A power conversion circuit according to a conceivable technique includes a plurality of semiconductor components. Each of the plurality of semiconductor components rises in temperature by energization. If there is variation in the amount of heat exchange with, for example, a cooler, among a plurality of semiconductor components, the temperature difference between the plurality of semiconductor components may increase.

Therefore, an object of the embodiments described in this specification is to provide a semiconductor module in which an increase in temperature difference between a plurality of semiconductor components is suppressed, and a power module including the same.

A semiconductor module according to one aspect of the present embodiments has a first semiconductor component and a second semiconductor component provided in a cooler. The first semiconductor component includes a first semiconductor chip on which a first switch element is formed, and a first heat sink on which the first semiconductor chip is provided. The second semiconductor component includes a second semiconductor chip on which a second switch element is formed, and a second heat sink on which the second semiconductor chip is provided. The first semiconductor chip is smaller in size than the second semiconductor chip. An area of the first heat-conducting surface that contributes to heat conduction between the first semiconductor chip and the first heat sink is narrower than an area of the second heat-conducting surface that contributes to heat conduction between the second semiconductor chip and the second heat sink. A first region of the cooler in which the first semiconductor component is disposed has higher cooling performance than a second region of the cooler in which the second semiconductor component is disposed.

A power module according to one aspect of the present embodiments includes a cooler, and a semiconductor module having a first semiconductor component and a second semiconductor component provided in the cooler. The first semiconductor component includes a first semiconductor chip on which a first switch element is formed, and a first heat sink on which the first semiconductor chip is provided. The second semiconductor component includes a second semiconductor chip on which a second switch element is formed, and a second heat sink on which the second semiconductor chip is provided. The first semiconductor chip is smaller in size than the second semiconductor chip. An area of the first heat-conducting surface that contributes to heat conduction between the first semiconductor chip and the first heat sink is narrower than an area of the second heat-conducting surface that contributes to heat conduction between the second semiconductor chip and the second heat sink. A first region of the cooler in which the first semiconductor component is disposed has higher cooling performance than a second region of the cooler in which the second semiconductor component is disposed.

According to these, the difference between the amount of heat exchange between the first semiconductor component and the cooler and the amount of heat exchange between the second semiconductor component and the cooler is suppressed. Thus, an increase in temperature difference between the first semiconductor component and the second semiconductor component is suppressed.

The following will describe embodiments for carrying out the present disclosure with reference to the drawings. In each embodiment, parts corresponding to the elements described in the preceding embodiments are denoted by the same reference numerals, and redundant explanation may be omitted. When only a part of a configuration is described in an embodiment, another preceding embodiment may be applied to the other parts of the configuration.

When, in each embodiment, it is specifically described that combination of parts is possible, the parts can be combined. In a case where any obstacle does not especially occur in combining the parts of the respective embodiments, it is possible to partially combine the embodiments, the embodiment and the modification, or the modifications even when it is not explicitly described that combination is possible.

First Embodiment

<In-Vehicle System>

First, an in-vehicle system 100 provided with a power conversion unit 300 will be described based on FIG. 1. The in-vehicle system 100 is a system for an electric vehicle. The in-vehicle system 100 has a battery 200, a power conversion unit 300, and a motor 400.

Further, the in-vehicle system 100 has a plurality of ECUs (not shown). The ECUs transmit signals to and receive signals from each other via a bus wiring. The ECUs cooperate to control an electric vehicle. The ECUs control the regeneration and power running of the motor 400 according to a SOC of the battery 200. The SOC is an abbreviation for state of charge. The ECU is an abbreviation of electronic control unit.

The battery 200 includes a plurality of secondary batteries. The secondary batteries form a battery stack connected in series. The SOC of the battery stack corresponds to the SOC of the battery 200. As the secondary batteries, a lithium ion secondary battery, a nickel hydrogen secondary battery, an organic radical battery, or the like may be employed. The battery 200 corresponds to a power source.

A power conversion device 500 included in the power conversion unit 300 performs power conversion between the battery 200 and the motor 400. The power conversion device 500 converts the DC power of the battery 200 into AC power. The power conversion device 500 converts AC power generated by power generation (i.e., regeneration) of the motor 400 into DC power.

The motor 400 is connected to a shaft of an electric vehicle which is not shown. The rotational energy of the motor 400 is transmitted to traveling wheels of the electric vehicle via the shaft. On the contrary, the rotational energy of the traveling wheels is transmitted to the motor 400 via the shaft. In the drawings, the motor 400 is denoted as MG.

The motor 400 is electrically driven by an AC power supplied from the power conversion device 500. This applies a propulsive force to the running wheels. Further, the motor 400 is regenerated by the rotational energy transmitted from the traveling wheels. The AC power generated by this regeneration is converted into DC power by the power converter 500. This DC power is supplied to the battery 200. The DC power is also supplied to various electric loads mounted on the electric vehicle.

<Power Conversion Device>

Next, the power conversion device 500 will be described. The power conversion device 500 includes an inverter. The inverter converts the DC power of battery 200 into AC power. This AC power is supplied to the motor 400. Further, the inverter converts the AC power generated by the motor 400 into DC power. This DC power is supplied to the battery 200 and various electric loads.

As shown in FIG. 1, the power conversion device 500 includes a P bus bar 501 and a N bus bar 502. The battery 200 is connected to these P bus bar 501 and N bus bar 502. The P bus bar 501 is connected to the positive electrode of battery 200. The N bus bar 502 is connected to the negative electrode of battery 200.

Further, the power conversion device 500 includes a U-phase bus bar 503, a V-phase bus bar 504, and a W-phase bus bar 505. The motor 400 is connected to the U-phase bus bar 503, the V-phase bus bar 504, and the W-phase bus bar 505. In FIG. 1, connection parts of the various bus bars are indicated by white circles. These connection parts are electrically connected by, for example, bolts or welding.

The power conversion device 500 has a smoothing capacitor 570 and a U-phase semiconductor module 511 to a W-phase semiconductor module 513. The smoothing capacitor 570 has two electrodes. The P bus bar 501 is connected to one of these two electrodes. The N bus bar 502 is connected to the other of the two electrodes.

Each of the U-phase semiconductor module 511 to the W-phase semiconductor module 513 has a high-side switch 521 and a low-side switch 531. Each of the U-phase semiconductor module 511 to the W-phase semiconductor module 513 has a high-side diode 521*a* and a low-side diode 531*a*.

In this embodiment, an n-channel type MOSFET is employed as each of the high-side switch 521 and the low-side switch 531. As shown in FIG. 1, the source electrode of the high side switch 521 and the drain electrode of the low side switch 531 are connected. In this configuration, the high-side switch 521 and the low-side switch 531 are connected in series.

Further, a cathode electrode of the high-side diode 521*a* is connected to a drain electrode of the high-side switch 521. An anode electrode of the high-side diode 521*a* is connected to a source electrode of the high-side switch 521. In this configuration, the high-side diode 521*a* is connected in anti-parallel to the high-side switch 521.

Similarly, a cathode electrode of the low-side diode 531*a* is connected to a drain electrode of the low-side switch 531. An anode electrode of the low-side diode 531*a* is connected to a source electrode of the low-side switch 531. In this configuration, the low-side diode 531*a* is connected in anti-parallel to the low-side switch 531.

In this embodiment, a high-side switch 521 and a high-side diode 521*a* are formed on the first semiconductor chip 520, respectively. The high-side switch 521 and the high-side diode 521*a* are electrically connected in parallel in the first semiconductor chip 520. The high side diode 521 a is a diode different from the parasitic diode of the high side switch 521. The forming material of the first semiconductor chip 520 is, for example, a wide-gap semiconductor such as SiC.

Similarly, a low-side switch 531 and a low-side diode 531*a* are formed on the second semiconductor chip 530, respectively. The low-side switch 531 and the low-side diode 531 a are electrically connected in parallel with the second semiconductor chip 530. The low side diode 531 a is a diode different from the parasitic diode of the low side switch 531. The material for forming the second semiconductor chip 530 is the same as the material for forming the first semiconductor chip 520.

Each of the first semiconductor chip 520 and the second semiconductor chip 530 is covered and protected by a coating resin 540. The tips of terminals electrically connected to the drain electrode of the high-side switch 521, the midpoint between the high-side switch 521 and the low-side switch 531, and the source electrode of the low-side switch 531 are exposed from the coating resin 540. The tips of the terminals connected to the gate electrodes of the high-side switch 521 and the low-side switch 531 are exposed from the coating resin 540. These terminals are hereinafter referred to as a drain terminal 550*a*, a source terminal 550*b*, a midpoint terminal 550*c*, and a gate terminal 550*d*.

This drain terminal 550*a* is connected to the P bus bar 501. The source terminal 550*b* is connected to the N bus bar 502. In this configuration, the high-side switch 521 and the low-side switch 531 are sequentially connected in series from the P bus bar 501 to the N bus bar 502.

The midpoint terminal 550*c* of the U-phase semiconductor module 511 is connected to a U-phase stator coil of the motor 400 via the U-phase bus bar 503. The midpoint terminal 550*c* of the V-phase semiconductor module 512 is connected to the V-phase stator coil via the V-phase bus bar 504. The midpoint terminal 550*c* of the W-phase semiconductor module 513 is connected to the W-phase stator coil via a W-phase bus bar 505.

The gate terminal 550*d* of the high-side switch 521 included in each of the U-phase semiconductor module 511 to the W-phase semiconductor module 513 is connected to the gate driver of the control substrate 580 via the first gate wiring 550*e*. Similarly, the gate terminal 550*d* of the low-side switch 531 included in the U-phase semiconductor module 511 to the W-phase semiconductor module 513 is connected to the gate driver of the control board 580 via the second gate wiring 550*f*. The first gate wiring 550*e* and the second gate wiring 550*f* include the wiring pattern of the control substrate 580.

This control board 580 includes a gate driver. This control board 580 or another board also includes one of a plurality of ECUs. In the drawings, the control board 580 is denoted as CB.

The ECU generates control signals. This control signal is input to the gate driver. The gate driver amplifies the control signal and outputs it to the first gate wiring 550*e* and the second gate wiring 550*f*. Thereby, the high-side switch 521 and the low-side switch 531 are controlled to open and close.

The ECU generates a pulse signal as the control signal. The ECU adjusts the on-duty ratio and a frequency of this pulse signal. The on-duty ratio and the frequency are determined based on the output of a current sensor and the output of a rotation angle sensor (not shown), the target torque of motor 400, the SOC of battery 200, and the like.

When the motor 400 is powered, each of the high-side switch 521 and the low-side switch 531 provided in the three-phase semiconductor module is PWM-controlled by the output of the control signal from the ECU. Thereby, a three-phase alternating current is generated in the power conversion device 500.

When the motor 400 generates (i.e., regenerates) electricity, the ECU stops the output of the control signal, for example. In this way, the AC power generated by the power generation passes through the diodes provided in the three phase semiconductor module. As a result, the AC power is converted to DC power.

The types of switch elements (or transistors) included in each of the U-phase semiconductor module 511 to W-phase semiconductor module 513 are not particularly limited. For example, an IGBT may be used as the switch element instead of the MOSFET. Also, the types of switch elements provided in each of the U-phase semiconductor module 511 to the W-phase semiconductor module 513 may be the same or different.

Materials for forming the first semiconductor chip 520 and the second semiconductor chip 530 are not particularly limited. As a material for forming these semiconductor chips, instead of SiC, for example, GaN or Si may be adopted.

Also, in order to reduce the amount of current flowing through the first semiconductor chip 520 and the second semiconductor chip 530, the following configuration may be adopted. A configuration in which a diode formed in a semiconductor chip separate from the first semiconductor chip 520 is connected in anti-parallel to the high-side switch 521 may be employed. A configuration in which a diode formed in a semiconductor chip separate from the second semiconductor chip 530 is connected in anti-parallel to the low-side switch 531 may be employed. In this modification, the first semiconductor chip 520 and the second semiconductor chip 530 may not have diodes other than the parasitic diodes of the switches.

<Dead Time>

When the ECU performs PWM control of the switches, in order to prevent the high-side switch 521 and the low-side switch 531 of the same phase from turning on at the same time, a dead time is provided in which the two switches are turned off at the same time. The ECU determines this dead time based on the higher of the two switch temperatures. The higher the temperature, the longer the ECU sets the dead time.

Since such control is performed, the dead time becomes longer when the temperature of at least one of the two switches rises. During the dead time, current flows through the diodes connected anti-parallel to these switches. Power consumption increases when the amount of current flowing through the diode increases due to the extension of the dead time. Moreover, deterioration of the diode is accelerated.

<Configuration of Power Conversion Unit>

Next, the configuration of the power conversion unit 300 will be described. Three directions orthogonal to one another are referred to as an X-direction, a Y-direction, and a Z-direction.

(Semiconductor Module)

Figure 3:
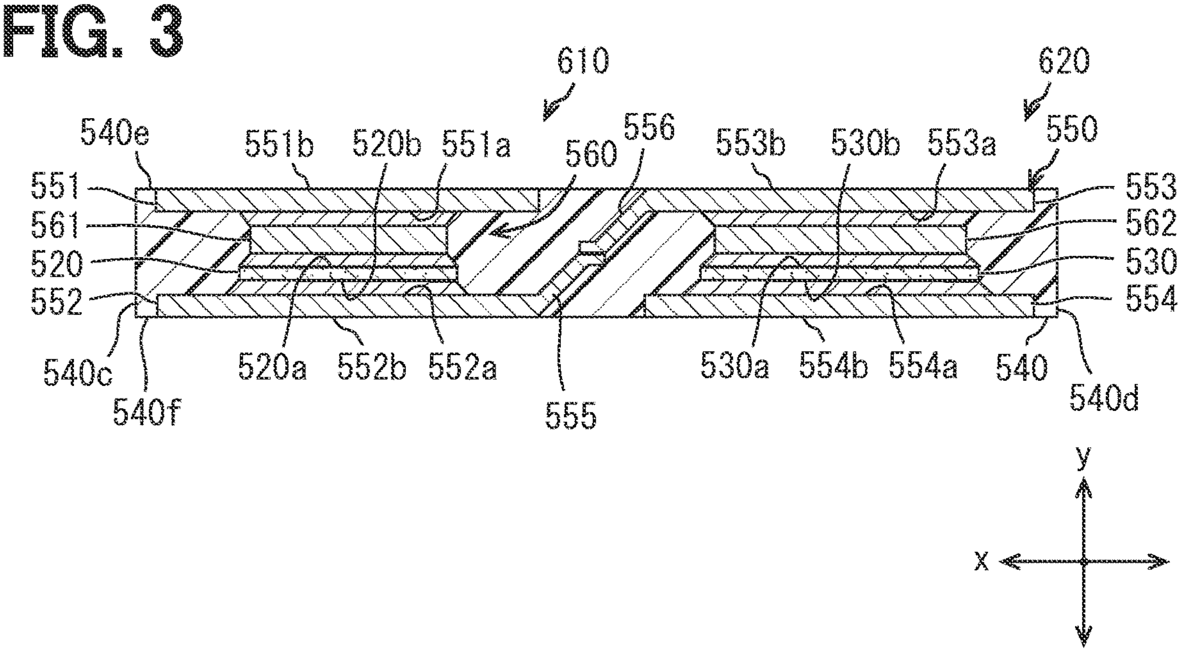
FIG. 3 is a diagram showing a cross-sectional view taken along line III-III of FIG. 2.

Each of the U-phase semiconductor module 511 to the W-phase semiconductor module 513 has a main conductive portion 550 and a terminal 560 shown in FIG. 3 in addition to the components described above. The main conductive portion 550 and the terminal 560 are integrally covered and protected by the coating resin 540 together with the first semiconductor chip 520 and the second semiconductor chip 530.

As shown in FIG. 3, the main conductive portion 550 has a first conductive portion 551, a second conductive portion 552, a third conductive portion 553 and a fourth conductive portion 554. The terminal 560 has a first terminal 561 and a second terminal 562.

<First Semiconductor Component>

The first conductive portion 551 and the second conductive portion 552 are separated in the y direction. A first terminal 561 and a first semiconductor chip 520 are provided between the first conductive portion 551 and the second conductive portion 552. The first conductive portion 551 and the second conductive portion 552 correspond to the first heat sink.

The first semiconductor chip 520 has a flat plate shape with a thin thickness in the y direction. The first semiconductor chip 520 has a first surface 520*a* and a first back surface 520*b* aligned in the y-direction. A drain electrode and a gate electrode are formed on the first surface 520*a*. A source electrode is formed on the first rear surface 520*b*.

The MOSFET and the diode included in the first semiconductor chip 520 have a vertical structure in which current flows between the drain electrode on the first surface 520*a* and the source electrode on the first back surface 520*b*. The MOSFET and the diode are connected in parallel between these drain and source electrodes.

The drain electrode of the first semiconductor chip 520 is connected to the first conductive portion 551 via solder and the first terminal 561. The source electrode of the first semiconductor chip 520 is connected to the second conductive portion 552 through solder.

With such a configuration, the first semiconductor chip 520 is electrically connected to the first conductive portion 551 and the second conductive portion 552, respectively. The first semiconductor chip 520 may conduct heat with the first conductive portion 551 and the second conductive portion 552, respectively. Hereinafter, the first conductive portion 551, the second conductive portion 552, and the components electrically and thermally connected between these two conductive portions will be collectively referred to as a first semiconductor component 610 as required. The high side switch 521 corresponds to the first switch element. The high-side diode 521*a* corresponds to the first free wheel diode.

<Second Semiconductor Component>

The third conductive portion 553 and the fourth conductive portion 554 are separated in the y direction. A second terminal 562 and a second semiconductor chip 530 are provided between the third conductive portion 553 and the fourth conductive portion 554. The third conductive portion 553 and the fourth conductive portion 554 correspond to the second heat sink.

The second semiconductor chip 530 has a flat plate shape with a thin thickness in the y direction. The second semiconductor chip 530 has a second surface 530*a* and a second back surface 530*b* aligned in the y-direction. A drain electrode and a gate electrode are formed on the second surface 530*a*. A source electrode is formed on the second rear surface 530*b*.

The MOSFET and the diode included in the second semiconductor chip 530 have a vertical structure in which current flows between the drain electrode on the second surface 530*a* and the source electrode on the second back surface 530*b*. The MOSFET and the diode are connected in parallel between these drain and source electrodes.

The drain electrode of the second semiconductor chip 530 is connected to the third conductive portion 553 via solder and the second terminal 562. The source electrode of the second semiconductor chip 530 is connected to the fourth conductive portion 554 through solder.

With such a configuration, the second semiconductor chip 530 is electrically connected to the third conductive portion 553 and the fourth conductive portion 554, respectively. The second semiconductor chip 530 may conduct heat with the third conductive portion 553 and the fourth conductive portion 554, respectively. Hereinafter, the third conductive portion 553, the fourth conductive portion 554, and the components electrically and thermally connected between these two conductive portions will be collectively referred to as a second semiconductor component 620 as required. The low side switch 531 corresponds to the second switch element. The low-side diode 531*a* corresponds to the second free wheel diode.

(Semiconductor Module)

Each of the U-phase semiconductor module 511 to the W-phase semiconductor module 513 includes the first semiconductor component 610 and the second semiconductor component 620 described above. As shown in FIG. 3, the first semiconductor component 610 and the second semiconductor component 620 are arranged side by side in the x direction.

The first conductive portion 551 of the first semiconductor component 610 and the third conductive portion 553 of the second semiconductor component 620 are arranged in the x direction. The second conductive portion 552 and the fourth conductive portion 554 are arranged in the x direction. Each of the first conductive portion 551 and the third conductive portion 553 is separated from each of the second conductive portion 552 and the fourth conductive portion 554 in the y direction.

In this embodiment, the first relay conductive portion 555 extends from the second conductive portion 552 toward the third conductive portion 553. A second relay conductive portion 556 extends from the third conductive portion 553 toward the second conductive portion 552. These two relay conductive portions are electrically connected via solder or the like. By the connection configuration described above, the first semiconductor component 610 and the second semiconductor component 620 are electrically connected.

A configuration in which only one of the first relay conductive portion 555 and the second relay conductive portion 556 is included in the semiconductor module may be adopted. In this modification, a relay conductive portion extending from one of the two conductive portions separated in the y direction is connected to the other of the two conductive portions.

Although the connection point is not shown in the drawings, the drain terminal 550*a* is integrally connected to the first conductive portion 551. A midpoint terminal 550*c* is integrally connected to one of the second conductive portion 552 and the third conductive portion 553. A source terminal 550 *b* is integrally connected to the fourth conductive portion 554. The connection points between these conductive portions and terminals are covered with a coating resin 540.

Although not shown, the gate electrodes of the first semiconductor chip 520 and the second semiconductor chip 530 are electrically connected to the gate terminal 550*d* via wires. A connection portion between the wire and the wire of the gate terminal 550*d* is covered with a coating resin 540, respectively.

<Coating Resin>

The coating resin 540 is made of epoxy resin, for example. The coating resin 540 is formed by, for example, a transfer molding method. The first semiconductor component 610 and the second semiconductor component 620 each commonly includes this coating resin 540.

Figure 2:
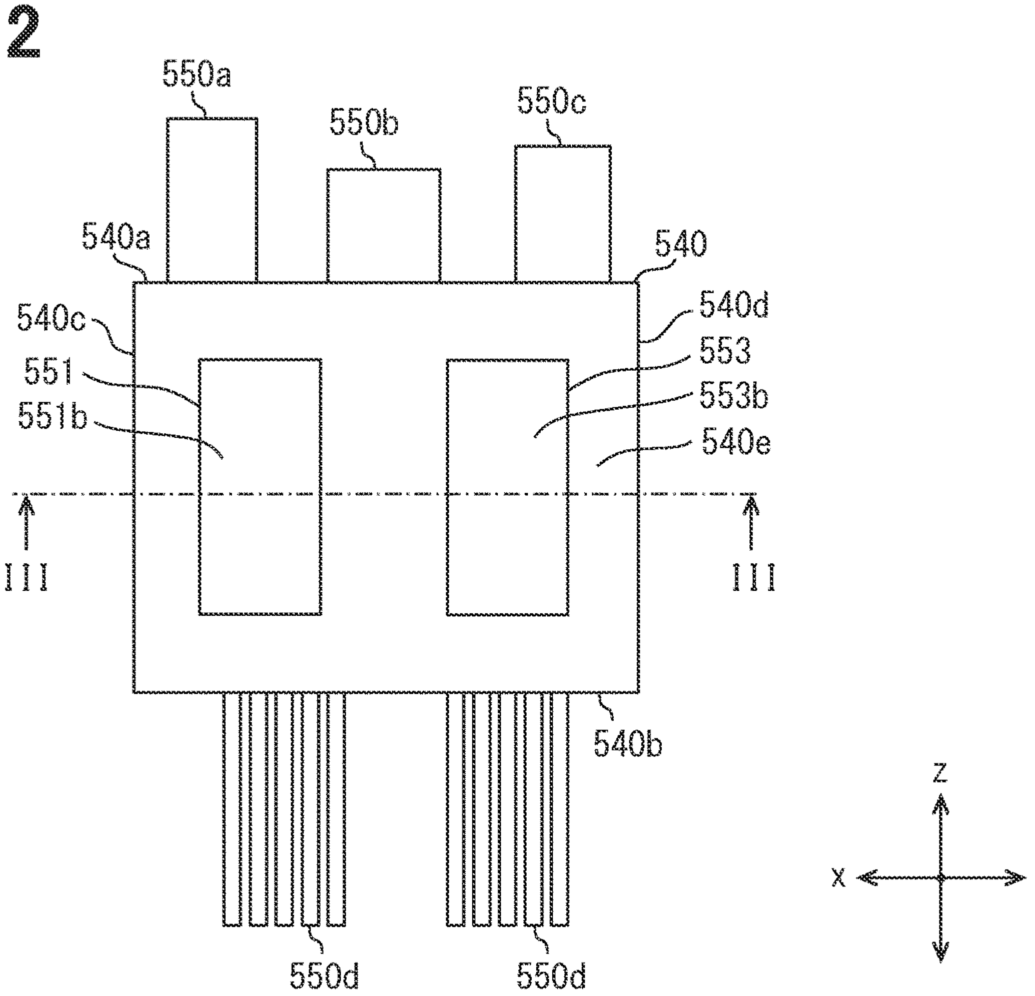
FIG. 2 is a diagram showing a top view of a semiconductor module.

As shown in FIGS. 2 and 3, the coating resin 540 has a flat shape with a thin thickness in the y direction. The coating resin 540 has a rectangular parallelepiped shape with six faces. The coating resin 540 includes an upper surface 540*a* and a lower surface 540*b* spaced apart in the z direction, a left surface 540*c* and a right surface 540*d* spaced apart in the x direction, and a first main surface 540*e* and a second main surface 540*f* spaced apart in the y direction.

As shown in FIG. 2, the tips of the drain terminal 550*a*, the source terminal 550*b*, and the midpoint terminal 550*c* protrude from the upper surface 540*a* in the z direction. The drain terminal 550*a*, the source terminal 550*b*, and the midpoint terminal 550*c* are arranged in order from the left surface 540*c* toward the right surface 540*d*. Also, the tip of the gate terminal 550*d* protrudes in the z-direction from the lower surface 540*b*.

As shown in FIG. 3, the first connection surface 551*a* side of the first conductive portion 551 to which the first terminal 561 is connected is covered with a coating resin 540. The third connection surface 553*a* side of the third conductive portion 553 to which the second terminal 562 is connected is covered with a coating resin 540.

Here, the first exposed surface 551*b* on the back side of the first connection surface 551*a* in the first conductive portion 551 is exposed from the coating resin 540. A third exposed surface 553*b* on the back side of the third connection surface 553*a* of the third conductive portion 553 is exposed from the coating resin 540. The first exposed surface 551*b* and the third exposed surface 553*b* are disposed on the same plane as the first main surface 540*e* of the coating resin 540. Alternatively, the first exposed surface 551*b* and the third exposed surface 553*b* slightly protrude in the y direction from the first main surface 540*e*.

Similarly, the second connection surface 552*a* side of the second conductive portion 552 to which the first semiconductor chip 520 is connected is covered with the coating resin 540. A fourth connection surface 554*a* side of the fourth conductive portion 554 to which the second semiconductor chip 530 is connected is covered with a coating resin 540.

Here, the second exposed surface 552*b* on the back side of the second connection surface 552*a* in the second conductive portion 552 is exposed from the coating resin 540. A fourth exposed surface 554*b* on the back side of the fourth connection surface 554*a* of the fourth conductive portion 554 is exposed from the coating resin 540. The second exposed surface 552*b* and the fourth exposed surface 554*b* are disposed on the same plane as the second main surface 540*f* of the coating resin 540. Alternatively, the second exposed surface 552*b* and the fourth exposed surface 554*b* slightly protrude in the y direction from the second main surface 540*f*.

<Size>

In this embodiment, the first semiconductor component 610 and the second semiconductor component 620 have the same size. The first conductive portion 551 and the third conductive portion 553 have the same physical size. Therefore, the areas of the first exposed surface 551 *b* and the third exposed surface 553*b* are equal. Similarly, the second conductive portion 552 and the fourth conductive portion 554 have the same size. Therefore, the areas of the second exposed surface 552*b* and the fourth exposed surface 554*b* are equal.

Here, the internal structures of the first semiconductor component 610 and the second semiconductor component 620 are different. As shown in FIG. 3, the first semiconductor chip 520 of the first semiconductor component 610 is smaller in size than the second semiconductor chip 530 of the second semiconductor component 620.

Due to the difference in physical size, the first surface 520*a* and the first back surface 520*b* of the first semiconductor chip 520 are smaller in area than the second surface 530*a* and the second back surface 530*b* of the second semiconductor chip 530, respectively. A first heat conduction area, which is the sum of the areas of the first surface 520*a* and the first back surface 520*b*, is smaller than a second heat conduction area, which is the sum of the areas of the second surface 530*a* and the second back surface 530*b*. The total area of solder on each of the first surface 520*a* and the first back surface 520*b* is smaller than the total area of solder on each of the second surface 530*a* and the second back surface 530*b*. The first surface 520*a* and the first rear surface 520*b* correspond to a plurality of first heat conducting surfaces. The second surface 530*a* and the second back surface 530*b* correspond to a plurality of second heat conducting surfaces.

Due to the difference in heat conduction area, the thermal resistance between the first semiconductor chip 520 and the first conductive portion 551 the thermal resistance between the first semiconductor chip 520 and the second conductive portion 552 are higher than the thermal resistance between the second semiconductor chip 530 and the third conductive portion 553 and the thermal resistance between the second semiconductor chip 530 and the fourth conductive portion 554, respectively. Heat generated in the first semiconductor chip 520 is more difficult to conduct to the conductive portion than heat generated in the second semiconductor chip 530. Simply, the first semiconductor component 610 has a lower heat dissipation performance than the second semiconductor component 620. In other words, the second semiconductor component 620 has higher heat dissipation performance than the first semiconductor component 610.

As described above, the first semiconductor chip 520 is smaller in size than the second semiconductor chip 530. Therefore, the first semiconductor chip 520 has a lower heat resistance performance than the second semiconductor chip 530.

Further, in the present embodiment, the electrical resistance of the high-side switch 521 in the energized state is equal to or less than the electrical resistance of the low-side switch 531 in the energized state. The amount of heat generated in the first semiconductor chip 520 due to energization is less than or equal to the amount of heat generated in the second semiconductor chip 530.

<Difference in Switching Speed>

As described above, the first semiconductor chip 520 and the second semiconductor chip 530 are made of the same semiconductor material. The high-side switch 521 formed on the first semiconductor chip 520 and the low-side switch 531 formed on the second semiconductor chip 530 are the same type of transistor (i.e., MOSFET). Therefore, the properties of the high-side switch 521 and the low-side switch 531 are equivalent.

Here, the first energization path between the gate electrode of the high-side switch 521 and the control substrate 580 has higher electrical resistance than the second energization path between the gate electrode of the low-side switch 531 and the control substrate 580. Therefore, the switching speed of the high side switch 521 is slower than that of the low side switch 531. Specifically, the switching speed of the high-side switch 521 is slower than that of the low-side switch 531 when changing from the energization state to the cut off state. At the same time, the switching speed of the high-side switch 521 is slower than that of the low-side switch 531 when switching from the cut-off state to the energization state. One of the switching speed when transitioning from the energization state to the cut off state and the switching speed when transitioning from the cut off state to the energization state may be slower.

The electrical resistance of the first energization path is the sum of the electrical resistances of the gate terminal 550*d* of the first semiconductor component 610 and the first gate wiring 550*e* connecting the gate terminal 550*d* and the control substrate 580. The electrical resistance of the second energization path is the sum of the electrical resistances of the gate terminal 550*d* of the second semiconductor component 620 and the second gate wiring 550*f* connecting the gate terminal 550*d* and the control board 580.

In this embodiment, the gate terminal 550*d* of the first semiconductor component 610 has a higher electrical resistance than the gate terminal 550*d* of the second semiconductor component 620. The electrical resistances of the first gate wiring 550*e* and the second gate wiring 550*f* are equal.

A configuration in which the high-side switch 521 and the low-side switch 531 have the same switching speed may also be adopted. A configuration where the switching speed of the low side switch 531 is slower than the high side switching 521 at least one of when transitioning from the energization state to the cut-off state and when transitioning from the cut-off state to the energization state may be adopted.

<Cooler>

Figure 4:
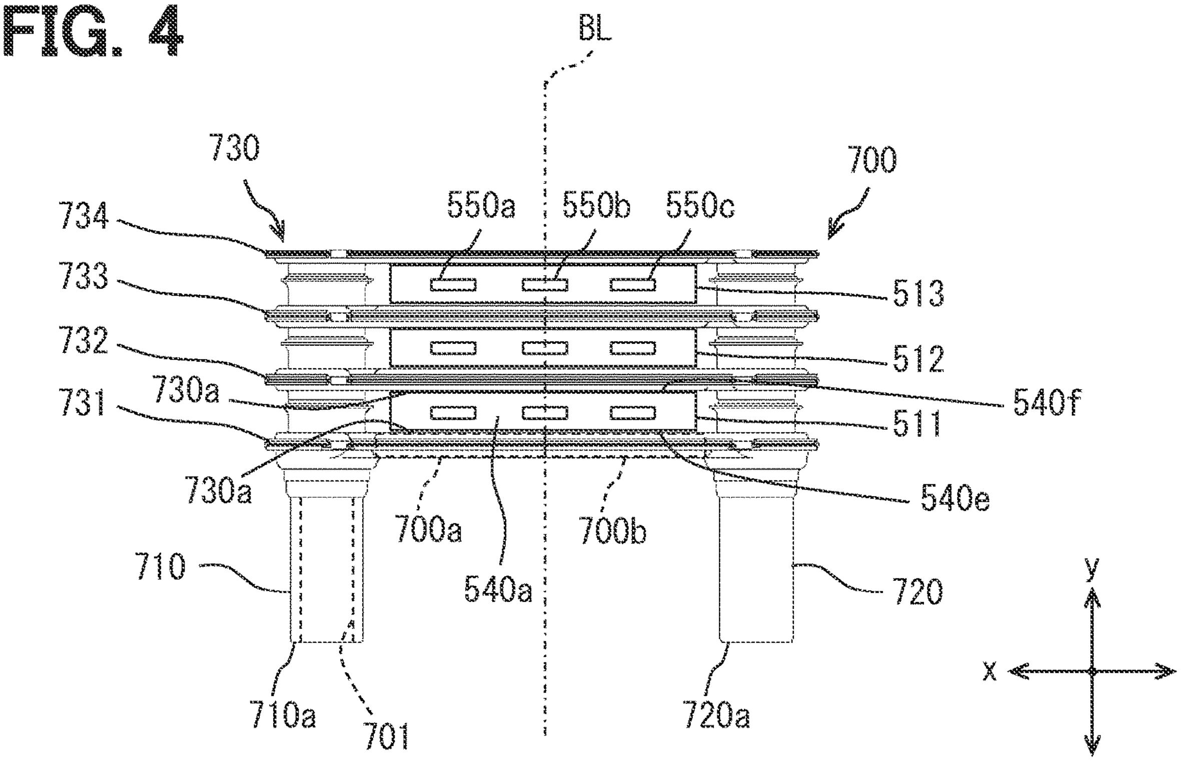
FIG. 4 is a diagram showing a plan view illustrating the power module.

The power conversion unit 300 has a cooler 700 shown in FIG. 4 in addition to the power conversion device 500. The cooler 700 functions to accommodate the U-phase semiconductor module 511 to the W-phase semiconductor module 513 and cool them.

As shown in FIG. 4, the cooler 700 has a supply pipe 710, a discharge pipe 720, and a plurality of relay pipes 730. The supply pipe 710 and the discharge pipe 720 are connected via a plurality of relay pipes 730. Refrigerant is supplied to the supply pipe 710. The refrigerant flows from the supply pipe 710 to the discharge pipe 720 via a plurality of relay pipes 730.

The supply pipe 710 and the discharge pipe 720 each extend in the y-direction. The supply pipe 710 and the discharge pipe 720 are spaced apart in the x-direction. Each of the multiple relay pipes 730 extends in the x-direction from the supply pipe 710 toward the discharge pipe 720. A supply port 710*a* of the supply pipe 710 through which the refrigerant is supplied from the outside and a discharge port 720*a* of the discharge pipe 720 which discharges the refrigerant supplied from the relay pipe 730 to the outside are spaced apart in the x direction. The positions of the supply port 710*a* and the discharge port 720*a* in the y direction are the same.

A plurality of relay pipes 730 are spaced apart in the y direction and arranged side by side. Each of the plurality of relay pipes 730 has two cooling surfaces 730*a* spaced apart in the y direction. A gap is defined (i.e., disposed) between the cooling surfaces 730*a* of the two relay pipes 730 adjacent in the y direction. The y direction corresponds to the separation direction.

<Gap>

As shown in FIG. 4, the cooler 700 of this embodiment has four relay pipes 730. In the following, to simplify the explanation, these four relay pipes 730 are given numbers that increase with distance from the supply port 710*a* in the y direction, and are denoted as first relay pipe 731 to fourth relay pipe 734.

The length of the refrigerant flow path 701 from the supply port 710*a* to the discharge port 720*a* via these four relay pipes 730 increases as the number given to the relay pipes 730 increases. In other words, the resistance of the refrigerant flow path 701 from the supply port 710*a* to the discharge port 720*a* via the four relay pipes 730 increases as the number given to the relay pipes 730 increases.

Figure 5:
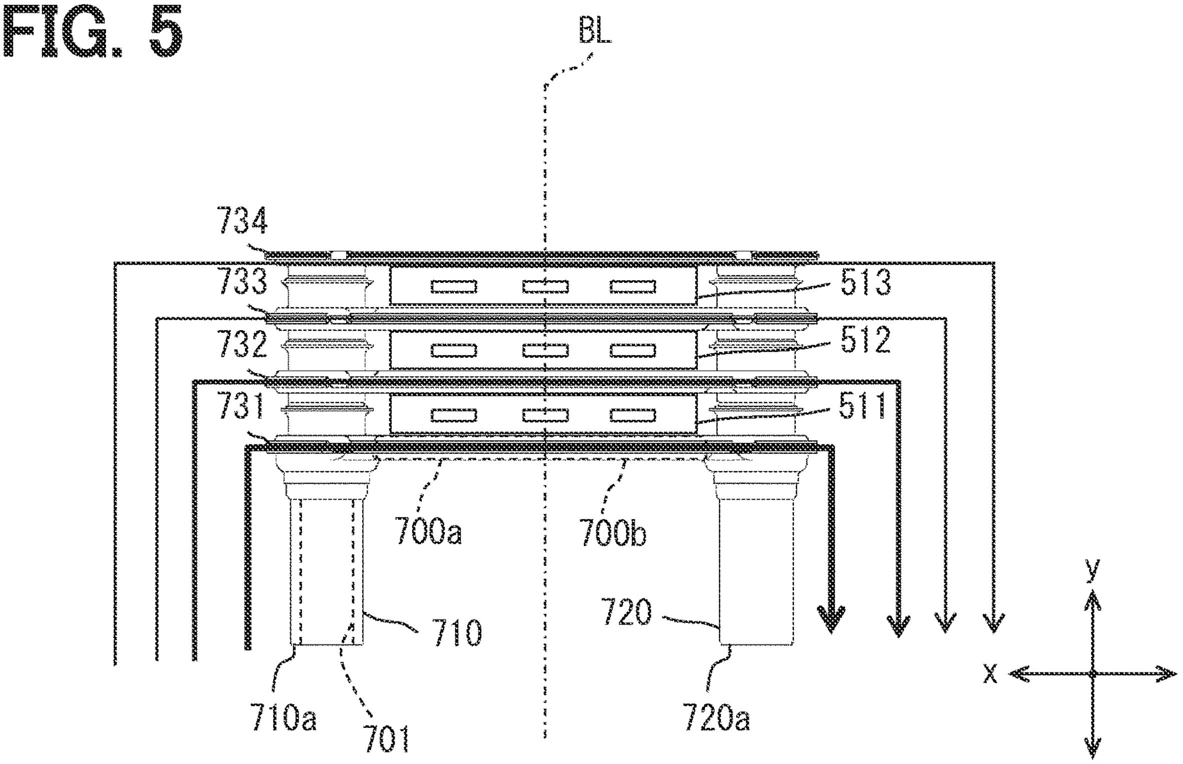
FIG. 5 is a diagram showing a top view for explaining the flow rate of refrigerant.

Therefore, as indicated by the thickness of the arrow in FIG. 5, the refrigerant flows most easily through the flow path 701 via the first relay pipe 731. After that, the refrigerant easily flows through the flow path 701 via the second relay pipe 732. After that, the refrigerant easily flows through the flow path 701 via the third relay pipe 733. After that, the refrigerant easily flows through the flow path 701 via the fourth relay pipe 734. In FIGS. 4 and 5, only a portion of the supply pipe 710 provided in the flow path 701 of the cooler 700 is indicated by a broken line.

Considering the cooler 700 alone, the first gap formed between the first relay pipe 731 and the second relay pipe 732 adjacent to each other in the y direction has the closest temperature to the temperature of the refrigerant supplied to the supply port 710*a* because of the ease with which the refrigerant flows as described above. Next, the temperature of the second gap formed between the second relay pipe 732 and the third relay pipe 733 adjacent in the y direction is closer to the temperature of the refrigerant supplied to the supply port 710*a*. Next, the temperature of the third gap formed between the third relay pipe 733 and the fourth relay pipe 734 adjacent in the y direction is closer to the temperature of the refrigerant supplied to the supply port 710*a*.

<Power Module>

In this embodiment, a U-phase semiconductor module 511 is provided in the first gap. A V-phase semiconductor module 512 is provided in the second gap. A W-phase semiconductor module 513 is provided in the third gap. The plurality of semiconductor modules and the cooler 700 constitute a power module.

<Cooling Performance>

Each of these three-phase semiconductor modules opposes each of the two relay pipes 730 forming the gap in the y direction. A biasing force along the y direction is applied to the cooler 700 from a spring body (not shown). This biasing force compresses the plurality of relay pipes 730 in the y direction. As a result, the y-direction width of each of the plurality of gaps is narrowed. A contact area between the semiconductor module and the relay pipe 730 is increased.

Due to such a configuration, the semiconductor module and the cooler 700 can positively conduct heat. Heat generated in the semiconductor module is easily transferred to the refrigerant flowing inside the relay pipes 730 via the two relay pipes 730 that are arranged side by side in the y direction.

Specifically, the heat generated in the U-phase semiconductor module 511 is transferred to the refrigerant flowing through the first relay pipe 731 and the second relay pipe 732, respectively. The heat generated in V-phase semiconductor module 512 is transferred to the refrigerant flowing through the second relay pipe 732 and the third relay pipe 733 respectively. The heat generated in the W-phase semiconductor module 513 is transferred to the refrigerant flowing through the third relay pipe 733 and the fourth relay pipe 734 respectively.

In this way, the heat generated in one semiconductor module is transferred to the refrigerant flowing through the first relay pipe 731 and the fourth relay pipe 734 located on the end side among the four relay pipes 730 arranged in the y direction. On the other hand, the heat generated in the two semiconductor modules is transferred to the refrigerant flowing through the second relay pipe 732 and the third relay pipe 733 located inside.

Due to the difference in the amount of heat transfer, the temperature of the refrigerant flowing through the second relay pipe 732 and the third relay pipe 733 rises more easily than the temperature of the refrigerant flowing through the first relay pipe 731 and the fourth relay pipe 734. The cooling performance of the second relay pipe 732 and the third relay pipe 733 tends to be lower than that of the first relay pipe 731 and the fourth relay pipe 734.

Considering the flowability of the refrigerant in each of the first to fourth relay pipes 731 to 734 shown above and the heat transfer of the heat generated in the semiconductor module to the refrigerant flowing through these four relay pipes 730, the cooling performance of the first gap is higher than that of each of the second gap and the third gap. A difference in cooling performance between the second gap and the third gap is less likely to occur.

Here, a heat transfer member such as grease (not shown) is provided between the semiconductor module and the relay pipe 730. Therefore, the semiconductor module and the relay pipe 730 may not be in direct contact. Heat can be conducted between the semiconductor module and the relay pipe 730 via the heat transfer member.

Further, as described above, the cooler 700 has a so-called double-sided cooling configuration. However, the configuration of cooler 700 may not be limited to the above example. As the configuration of the cooler 700, for example, a single-sided cooling configuration may be adopted.

<First Region and Second Region>

Here, the semiconductor module has the first semiconductor component 610 and the second semiconductor component 620 as described above. These two semiconductor components share a coating resin 540.

The first exposed surface 551*b* of the first semiconductor component 610 and the third exposed surface 553*b* of the second semiconductor component 620 are exposed from the first main surface 540*e* of the coating resin 540. The first exposed surface 551*b* and the third exposed surface 553*b* are arranged in the x direction.

Similarly, the second exposed surface 552*b* of the first semiconductor component 610 and the fourth exposed surface 554*b* of the second semiconductor component 620 are exposed from the second main surface 540*f* of the coating resin 540. The second exposed surface 552*b* and the fourth exposed surface 554*b* are arranged in the x direction.

In a state where the semiconductor module provided in the gap between the two relay pipes 730, the first exposed surface 551*b* is arranged closer to the supply pipe 710 in the x direction than the third exposed surface 553*b*. In other words, the first exposed surface 551*b* is arranged closer to the supply port 710*a* in the flow path 701 than the third exposed surface 553*b*. The first exposed surface 551*b* is arranged on the upstream side of the flow path 701 from the third exposed surface 553*b*.

Similarly, in a situation where the semiconductor module provided in the gap between the two relay pipes 730, the second exposed surface 552*b* is arranged closer to the supply pipe 710 in the x direction than the fourth exposed surface 554*b*. In other words, the second exposed surface 552*b* is arranged closer to the supply port 710*a* in the flow path 701 than the fourth exposed surface 554*b*. The second exposed surface 552*b* is arranged on the upstream side of the flow path 701 from the fourth exposed surface 554*b*.

Due to the arrangement configuration described above, the first semiconductor component 610 is arranged on the upstream side of the flow path 701 from the second semiconductor component 620. Therefore, the first semiconductor component 610 exchanges heat with the refrigerant supplied from the supply pipe 710 to the relay pipe 730. The second semiconductor component 620 exchanges heat with the refrigerant heated by heat exchange with the first semiconductor component 610.

Thus, the first region 700*a* of the cooler 700 that exchanges heat with the first semiconductor component 610 has a higher cooling performance than the second region 700*b* that exchanges heat with the second semiconductor component 620. The first region 700*a* located upstream of the second region 700*b* in the flow path 701 has a higher cooling performance than the second region 700*b*. In other words, the second region 700*b* located downstream of the first region 700*a* in the flow path 701 has lower cooling performance than the first region 700*a*.

The first region 700*a* corresponds to a facing region of the relay pipe 730 facing the first semiconductor component 610 in the y direction. The second region 700*b* corresponds to a facing region of the relay pipe 730 facing the second semiconductor component 620 in the y direction.

In the drawing, among the first region 700*a* and the second region 700*b* included in each of the four relay pipes 730, only the first region 700*a* and the second region 700*b* included in the first relay pipe 731 are shown surrounded by broken lines. A boundary line BL passing through the boundary between these two regions and extending in the y direction is indicated by a dashed line.

<Exposed Surface>

Here, each of the first main surface 540*e* and the second main surface 540*f* of the coating resin 540 provided in the semiconductor module can conduct heat to the cooling surface 730*a* of the relay pipe 730 via grease. Therefore, heat exchange is performed between the coating resin 540 and the relay pipe 730.

However, as described above, the first exposed surface 551 *b* and the third exposed surface 553*b* are exposed from the first main surface 540*e*. A second exposed surface 552*b* and a fourth exposed surface 554*b* are exposed from the second main surface 540*f*.

Heat generated in the first semiconductor component 610 included in the semiconductor module is mainly conducted to the relay pipe 730 via the first exposed surface 551*b* and the second exposed surface 552*b*. The heat generated in second semiconductor component 620 is mainly conducted to relay pipe 730 via the third exposed surface 553*b* and the fourth exposed surface 554*b*.

A first total area obtained by summing the areas of the first exposed surface 551*b* and the second exposed surface 552*b* is equivalent to a second total area obtained by summing the areas of the third exposed surface 553*b* and the fourth exposed surface 554*b*. Therefore, the first thermal resistance between the first semiconductor component 610 and the cooler 700 and the second thermal resistance between the second semiconductor component 620 and the cooler 700 are the same.

The areas of the first exposed surface 551*b* and the area of the second exposed surface 552*b* are equal to each other. The areas of the third exposed surface 553*b* and the fourth exposed surface 554*b* are equal to each other.

Operation and Effects

As described above, the first region 700*a* in which the first semiconductor component 610 is provided has a higher cooling performance than the second region 700*b* in which the second semiconductor component 620 is provided. However, the first semiconductor component 610 has lower heat dissipation performance than the second semiconductor component 620. According to this, the difference between the amount of heat exchange between the first semiconductor component 610 and the cooler 700 and the amount of heat exchange between the second semiconductor component 620 and the cooler 700 is suppressed. Thus, an increase in temperature difference between the first semiconductor component 610 and the second semiconductor component 620 is suppressed.

Due to the above effects, an increase in the temperature difference between the high-side switch 521 included in the first semiconductor component 610 and the low-side switch 531 included in the second semiconductor component 620 is suppressed. One of the high-side switch 521 and the low-side switch 531 is prevented from becoming hotter than the other.

As a result, during PWM control, it is possible to suppress the lengthening of the time (i.e., dead time) during which both the high-side switch 521 and the low-side switch 531 are turned off at the same time. During the dead time, the diode connected anti-parallel to these two switches has less time for current to flow therethrough. This suppresses an increase in power consumption. Along with this, deterioration of the diode is suppressed.

Second Embodiment

In the first embodiment, the high-side switch 521 and the low-side switch 531, and the high-side diode 521*a* and the low-side diode 531*a* are respectively covered with one coating resin 540 to constitute one semiconductor module. That is, an example is shown in which two switches and two diodes included in a one-phase semiconductor module are coated with one coating resin 540.

On the other hand, in this embodiment, one coating resin 540 covers one switch and one diode. That is, one coating resin 540 covers the high-side switch 521 and the high-side diode 521*a*. A low-side switch 531 and a low-side diode 531*a* are covered with one coating resin 540.

Figure 6:
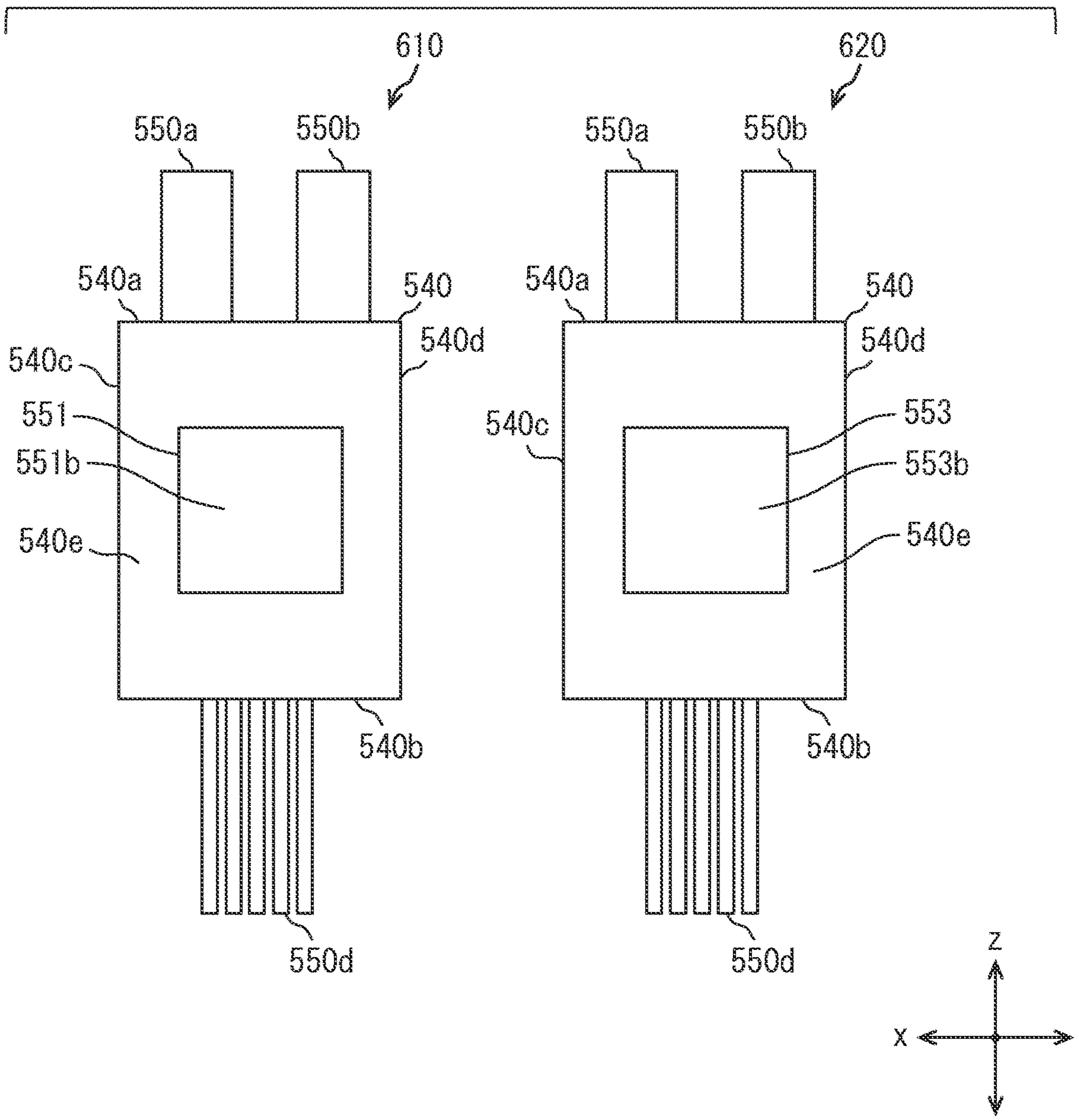
FIG. 6 is a diagram showing a top view showing a first semiconductor component and a second semiconductor component.

As shown in FIG. 6, the first semiconductor component 610 and the second semiconductor component 620 are separated. Each of these two semiconductor components has a drain terminal 550*a* and a source terminal 550*b*. Each of these two semiconductor components does not have the midpoint terminal 550*c* shown in the first embodiment. The source terminal 550*b* of the first semiconductor component 610 and the drain terminal 550*a* of the second semiconductor component 620 are electrically connected via a conductive member (not shown).

Also in this embodiment, the first semiconductor chip 520 is smaller in size than the second semiconductor chip 530. A first heat conduction area, which is the sum of the areas of the first surface 520*a* and the first back surface 520*b* of the first semiconductor chip 520, is narrower than a second heat conduction area, which is the sum of the areas of the second surface 530*a* and the second back surface 530*b* of the second semiconductor chip 530. Therefore, the thermal resistance between the first semiconductor chip 520 and the first conductive portion 551 the thermal resistance between the first semiconductor chip 520 and the second conductive portion 552 are higher than the thermal resistance between the second semiconductor chip 530 and the third conductive portion 553 and the thermal resistance between the second semiconductor chip 530 and the fourth conductive portion 554, respectively. The first semiconductor component 610 has lower heat dissipation performance than the second semiconductor component 620.

In the following description, the first semiconductor component 610 and the second semiconductor component 620 included in the U-phase semiconductor module 511 are referred to as a U-phase high-side component 611 and a U-phase low-side component 621 for simplicity of notation. A first semiconductor component 610 and a second semiconductor component 620 included in the V-phase semiconductor module 512 are indicated as a V-phase high-side component 612 and a V-phase low-side component 622. A first semiconductor component 610 and a second semiconductor component 620 included in the W-phase semiconductor module 513 are indicated as a W-phase high-side component 613 and a W-phase low-side component 623.

In addition, the supply pipe 710 side of the first gap is referred to as a first upstream region, and the discharge pipe 720 side is referred to as a first downstream region. The supply pipe 710 side of the second gap is referred to as a second upstream region, and the discharge pipe 720 side is referred to as a second downstream region. The supply pipe 710 side of the third gap is referred to as a third upstream region, and the discharge pipe 720 side is referred to as a third downstream region.

Figure 7:
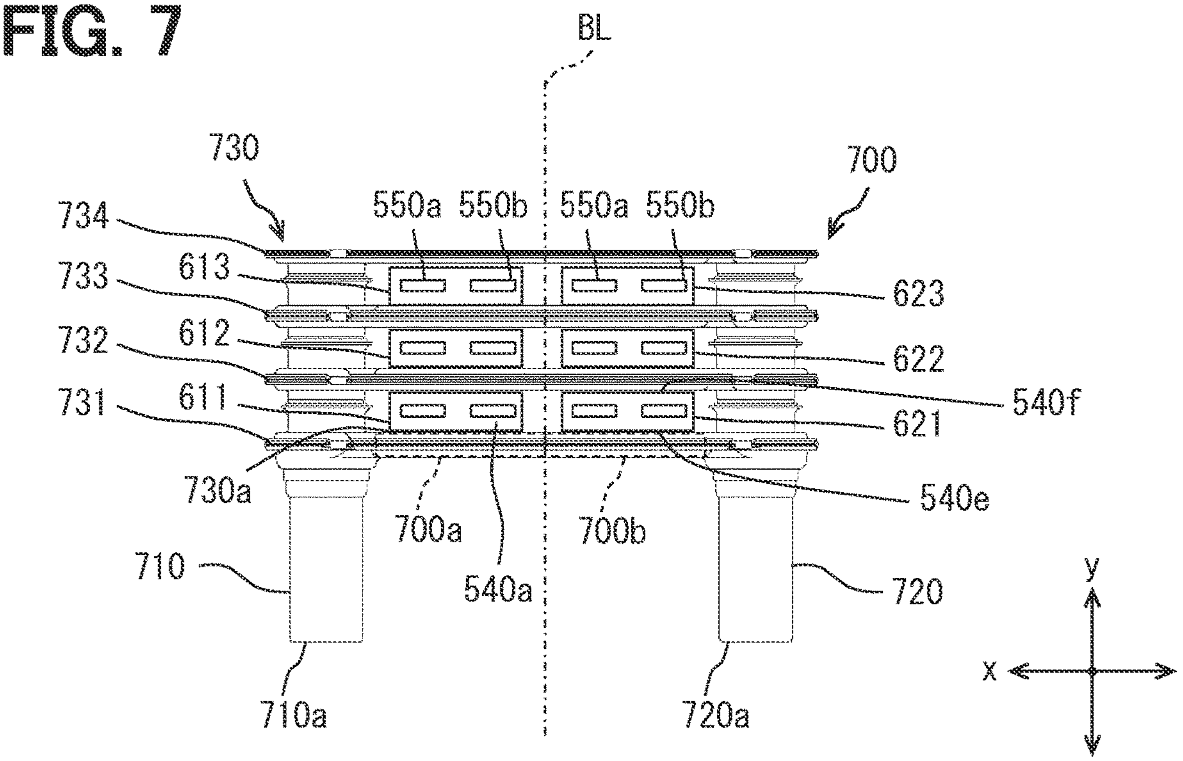
FIG. 7 is a diagram showing a plan view illustrating the power module.

In the example shown in FIG. 7, a U-phase high-side component 611 is provided in the first upstream region, and a U-phase low-side component 621 is provided in the first downstream region. A V-phase high-side component 612 is provided in the second upstream region, and a V-phase low-side component 622 is provided in the second downstream region. A W-phase high-side component 613 is provided in the third upstream region, and a W-phase low-side component 623 is provided in the third downstream region. This suppresses an increase in the temperature difference between the first semiconductor component 610 and the second semiconductor component 620 included in the one-phase semiconductor module.

Figure 8:
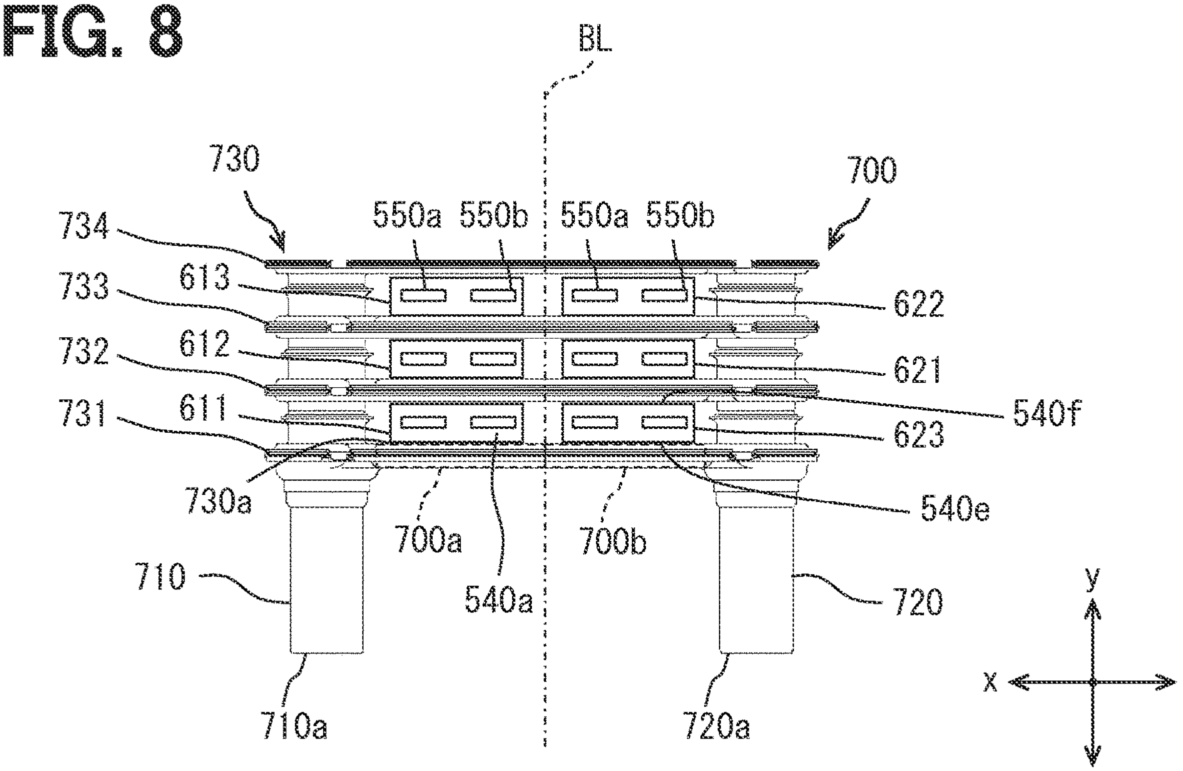
FIG. 8 is a diagram showing a plan view illustrating the power module.

In the example shown in FIG. 8, a U-phase high-side component 611 is provided in the first upstream region, and a W-phase low-side component 623 is provided in the first downstream region. A V-phase high-side component 612 is provided in the second upstream region, and a U-phase low-side component 621 is provided in the second downstream region. A W-phase high-side component 613 is provided in the third upstream region, and a V-phase low-side component 622 is provided in the third downstream region. This suppresses an increase in the temperature difference between the first semiconductor component 610 and the second semiconductor component 620 included in the one-phase semiconductor module, and suppresses an increase in the temperature difference in the three-phase semiconductor modules.

The power conversion unit 300 according to the present embodiment includes components equivalent to those of the power conversion unit 300 according to the first embodiment. Therefore, the power conversion unit 300 of this embodiment has the same effect as the power conversion unit 300 described in the first embodiment. Therefore, the description will be omitted. Additionally, the description related to the operation effect which is also generated in the following embodiments is also omitted.

Third Embodiment

The first embodiment shows an example in which the cooler 700 has three gaps. In contrast, in this embodiment, the cooler 700 has six gaps. The cooler 700 has seven relay pipes 730.

In order to simplify the notation below, these seven relay pipes 730 are given numbers that increase with distance from the supply port 710*a* in the y direction. These seven relay pipes 730 are referred to as a first relay pipe 731, a second relay pipe 732, a third relay pipe 733, a fourth relay pipe 734, a fifth relay pipe 735, a sixth relay pipe 736, and a seventh relay pipe 737. In addition, the six gaps formed by these seven first to seventh relay pipes 731 to 737 are given numbers that increase with increasing distance from the supply port 710*a* in the y direction so that the gaps are referred to as a first gap to sixth gap.

Considering the ease of flow of the refrigerant in each of the first to seventh relay pipes 731 to 737 and the heat exchange between the refrigerant and the semiconductor module, the cooling performance of the first gap is higher than that of the other gaps. The cooling performance increases in the order of the sixth gap, the second gap, the fifth gap, the third gap, and the fourth gap. The difference in cooling performance between the second to fourth gaps is smaller than the difference in cooling performance between these gaps and the first gap (or the sixth gap).

Figure 9:
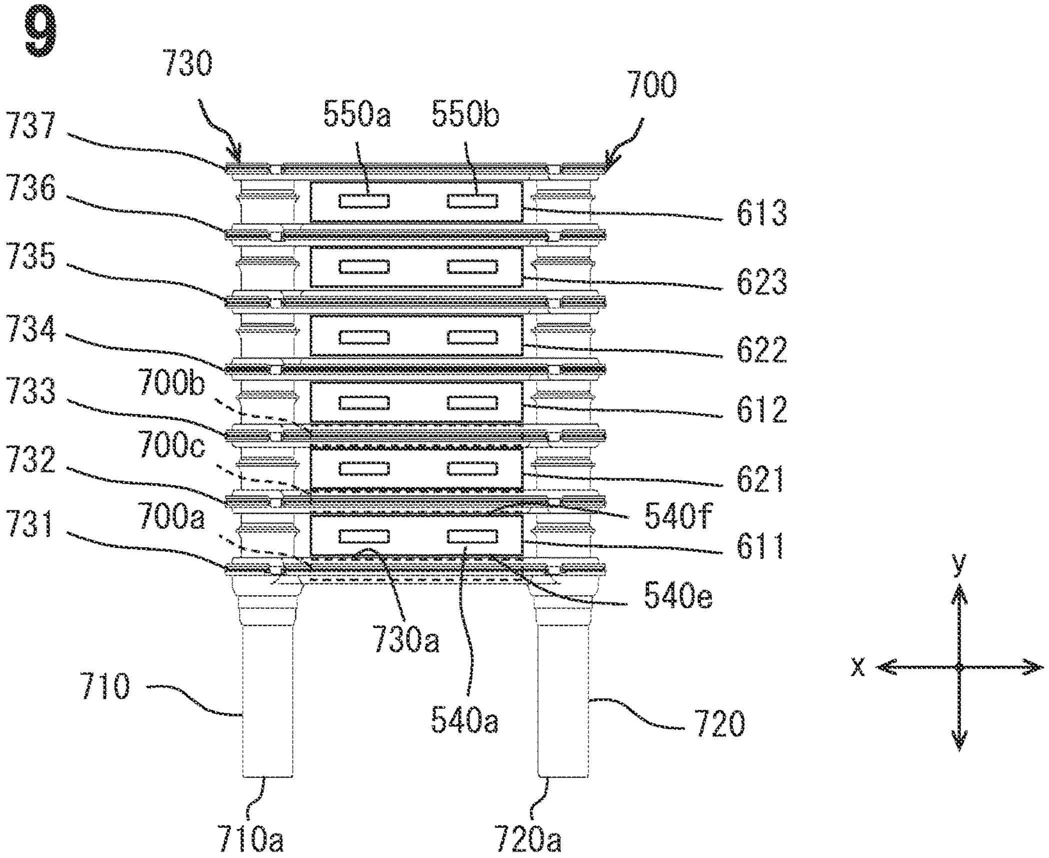
FIG. 9 is a diagram showing a plan view illustrating the power module.

In the example shown in FIG. 9, a U-phase high-side component 611 is provided in the first gap, and a U-phase low-side component 621 is provided in the second gap. A V-phase high-side component 612 is provided in the third gap, and a V-phase low-side component 622 is provided in the fourth gap. A W-phase high-side component 613 is provided in the sixth gap, and a W-phase low-side component 623 is provided in the fifth gap. This suppresses an increase in the temperature difference between the first semiconductor component 610 and the second semiconductor component 620 included in the one-phase semiconductor module.

In FIG. 9, only the region corresponding to the U-phase semiconductor module 511 is surrounded by a broken line among the first region 700*a* and the second region 700*b* corresponding to each of the three-phase semiconductor modules in order to avoid complication of notation. Also, a third region 700*c*, which exchanges heat with each of the U-phase high-side component 611 and the U-phase low-side component 621 provided in the U-phase semiconductor module 511, is surrounded by a dashed line.

Figure 10:
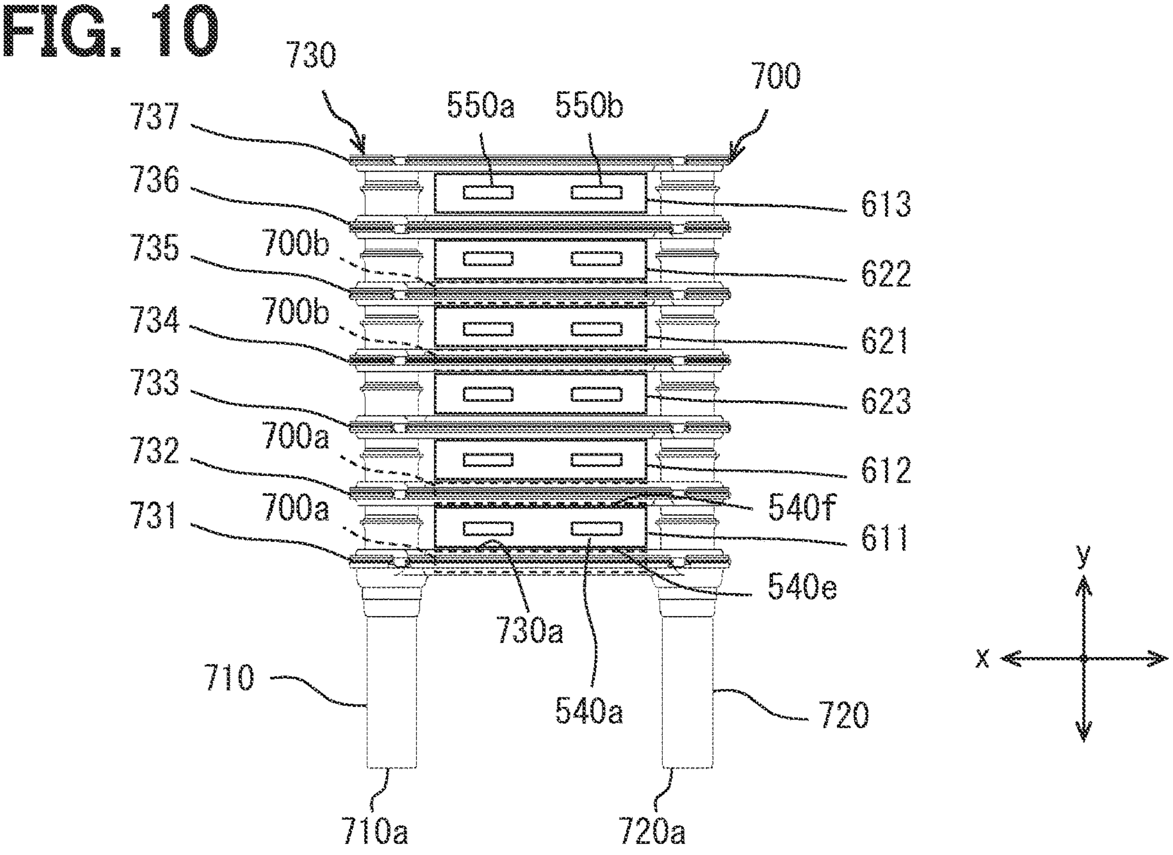
FIG. 10 is a diagram showing a plan view illustrating the power module.

In the example shown in FIG. 10, a U-phase high-side component 611 is provided in the first gap, and a U-phase low-side component 621 is provided in the fourth gap. A V-phase high-side component 612 is provided in the second gap, and a V-phase low-side component 622 is provided in the fifth gap. A W-phase high-side component 613 is provided in the sixth gap, and a V-phase low-side component 622 is provided in the third gap. This configuration suppresses an increase in the temperature difference between the first semiconductor component 610 and the second semiconductor component 620 included in the one-phase semiconductor module, and suppresses an increase in the temperature difference in the three-phase semiconductor modules.

In FIG. 10, only the region corresponding to the U-phase semiconductor module 511 is surrounded by a broken line among the first region 700*a* and the second region 700*b* corresponding to each of the three-phase semiconductor modules in order to avoid complication of notation.

In the configurations shown in FIGS. 9 and 10 described above, in order to facilitate connection between the source terminal 550*b* of the high-side component and the drain terminal 550*a* of the low-side component included in the one-phase semiconductor module, these two terminals may be aligned in the y-direction. That is, the projection area of the source terminal 550*b* of the high-side component in the y-direction and the projection area of the drain terminal 550*a* of the low-side component in the y-direction may overlap.

First Modification

In each embodiment, an example is shown in which the first semiconductor component 610 is provided at a location in the cooler 700 where the cooling performance is higher than that of the second semiconductor component 620. That is, an example is shown in which the high-side switch 521 and the high-side diode 521*a* are provided at a location in the cooler 700 where the cooling performance is higher than that of the low-side switch 531 and the low-side diode 531*a*.

Alternatively, it may be also possible to employ a configuration in which the low-side switch 531 and the low-side diode 531*a* are provided at a location in the cooler 700 with higher cooling performance than the high-side switch 521 and the high-side diode 521*a*. In such a configuration, the second heat transfer area is narrower than the first heat transfer area.

Second Modification

In this embodiment, the first semiconductor component 610 and the second semiconductor component 620 have the same size. That is, an example is shown in which the first conductive portion 551 and the third conductive portion 553 have the same physical size, and the second conductive portion 552 and the fourth conductive portion 554 have the same physical size. Alternatively, as long as there is a difference in heat dissipation performance between the first semiconductor component 610 and the second semiconductor component 620, the first conductive portion 551 and the third conductive portion 553 may have different physical sizes. The physical sizes of the second conductive portion 552 and the fourth conductive portion 554 may be different.

Third Modification

In the first embodiment, the configuration in which the second conductive portion 552 and the third conductive portion 553 are electrically connected is shown. Alternatively, a configuration in which the second conductive portion 552 and the fourth conductive portion 554 are electrically connected may also be adopted.

In such a configuration, the drain terminal 550 *a* is integrally connected to the first conductive portion 551. A midpoint terminal 550 *c* is integrally connected to at least one of the second conductive portion 552 and the fourth conductive portion 554. A source terminal 550*b* is integrally connected to the third conductive portion 553. A source electrode is formed on the second surface 530*a* of the second semiconductor chip 530, and a drain electrode is formed on the second back surface 530*b*.

OTHER MODIFICATIONS

In this embodiment, an example in which the power conversion device 500 includes an inverter is shown. Alternatively, the power conversion device 500 may include a converter in addition to the inverter.

In this embodiment, an example in which the power conversion unit 300 is included in the in-vehicle system 100 for an electric vehicle is shown. Alternatively, application of the power conversion unit 300 may not be particularly limited to the above example. For example, a configuration in which power conversion unit 300 is included in a system of a hybrid vehicle having a motor and an internal combustion engine may also be adopted. A configuration in which the power conversion unit 300 is included in the system of the electric vehicle may be adopted.

In this embodiment, an example in which one motor 400 is connected to the power conversion unit 300 is shown. Alternatively, a configuration in which a plurality of motors 400 are connected to power conversion unit 300 may also be adopted. In this case, the power conversion unit 300 has a plurality of three-phase semiconductor modules for configuring an inverter.

While the present disclosure has been described with reference to embodiments thereof, it is to be understood that the disclosure is not limited to the embodiments and constructions. The present disclosure covers various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A semiconductor module comprising:

a first semiconductor component and a second semiconductor component disposed in a cooler, wherein:

the first semiconductor component includes a first semiconductor chip on which a first switch element is arranged, and a first heat sink on which the first semiconductor chip is arranged;

the second semiconductor component includes a second semiconductor chip on which a second switch element is arranged, and a second heat sink on which the second semiconductor chip is arranged;

the first semiconductor chip is smaller in size than the second semiconductor chip;

a first heat conduction surface that contributes to heat conduction between the first semiconductor chip and the first heat sink is smaller in an area than a second heat conduction surface that contributes to heat conduction between the second semiconductor chip and the second heat sink; and a first region of the cooler where the first semiconductor component is disposed has higher cooling performance than a second region of the cooler where the second semiconductor component is disposed, wherein:

the first semiconductor component has a first free wheel diode connected in parallel with the first switch element and disposed on the first semiconductor chip together with the first switch element; and the second semiconductor component has a second free wheel diode connected in parallel with the second switch element and disposed on the second semiconductor chip together with the second switch element.

2. The semiconductor module according to claim 1, wherein:

the first switch element is electrically connected to a positive electrode of a power supply; and the second switch element is electrically connected to a negative electrode of the power supply.

3. The semiconductor module according to claim 2, wherein:

the first switch element and the second switch element are electrically connected in series between the positive electrode and the negative electrode.

4. The semiconductor module according to claim 2, wherein:

the first semiconductor component and the second semiconductor component commonly have a coating resin for covering and protecting the first semiconductor chip and the second semiconductor chip, respectively.

5. The semiconductor module according to claim 1, wherein:

a diode disposed in another semiconductor chip different from each of the first semiconductor chip and the second semiconductor chip is not connected to the first switch element and the second switch element.

6. The semiconductor module according to claim 1, wherein:

a material for forming each of the first switch element and the second switch element is SiC or GaN.

7. The semiconductor module according to claim 1, wherein:

an amount of heat generated in the first switch element due to energization is equal to or less than an amount of heat generated in the second switch element due to energization.

8. The semiconductor module according to claim 7, wherein:

an electric resistance of the first switch element in an energization state is equal to or less than an electric resistance of the second switch element in an energization state.

9. The semiconductor module according to claim 1, wherein:

the cooler includes a supply port to which a refrigerant is supplied, a discharge port to which the refrigerant is discharged, and a flow path connecting the supply port and the discharge port; and the first region is positioned closer to the supply port than the second region in the flow path.

10. The semiconductor module according to claim 9, wherein:

each of the first heat conduction surface and the second heat conduction surface is divided into a plurality of portions.

11. The semiconductor module according to claim 10, wherein:

the cooler includes a supply pipe having the supply port, a discharge pipe having the discharge port, and a plurality of relay pipes connecting the supply pipe and the discharge pipe; and the plurality of relay pipes include each of the first region and the second region.

12. The semiconductor module according to claim 11, wherein:

the plurality of relay pipes are spaced apart in a separation direction away from the supply port; and each of the first semiconductor component and the second semiconductor component is disposed in a gap between two of the relay pipes arranged side by side in the separation direction.

13. The semiconductor module according to claim 11, wherein:

the plurality of relay pipes are spaced apart in a separation direction away from the supply port; and a gap in which the first semiconductor component is arranged is positioned closer to the supply port in the flow path than a gap in which the second semiconductor component is arranged.

14. The semiconductor module according to claim 1, wherein:

the cooler includes a supply pipe having a supply port for supplying a refrigerant, a discharge pipe having a discharge port for discharging the refrigerant, and a plurality of relay pipes that connect the supply pipe and the discharge pipe and are arranged side by side in a separation direction away from the supply port;

at least three gaps defined by two of the relay pipes arranged side by side in the separation direction;

the first semiconductor component is disposed in one of the at least three gaps located at an end of the at least three gaps arranged in the separation direction; and the second semiconductor component is disposed in an other one of the at least three gaps located inside of the at least three gaps arranged in the separation direction.

15. The semiconductor module according to claim 1, wherein:

the first switch element is electrically connected to a negative electrode of a power supply; and the second switch element is electrically connected to a positive electrode of the power supply.

16. A semiconductor module comprising:

a first semiconductor component and a second semiconductor component disposed in a cooler, wherein:

the first semiconductor component includes a first semiconductor chip on which a first switch element is arranged, and a first heat sink on which the first semiconductor chip is arranged, the second semiconductor component includes a second semiconductor chip on which a second switch element is arranged, and a second heat sink on which the second semiconductor chip is arranged;

the first semiconductor chip is smaller in size than the second semiconductor chip;

a first heat conduction surface that contributes to heat conduction between the first semiconductor chip and the first heat sink is smaller in an area than a second heat conduction surface that contributes to heat conduction between the second semiconductor chip and the second heat sink; and a first region of the cooler where the first semiconductor component is disposed has higher cooling performance than a second region of the cooler where the second semiconductor component is disposed, wherein the first switch element and the second switch element are transistors of a same type.

17. A semiconductor module comprising:

a first semiconductor component and a second semiconductor component disposed in a cooler, wherein, the first semiconductor component includes a first semiconductor chip on which a first switch element is arranged, and a first heat sink on which the first semiconductor chip is arranged, the second semiconductor component includes a second semiconductor chip on which a second switch element is arranged, and a second heat sink on which the second semiconductor chip is arranged;

the first semiconductor chip is smaller in size than the second semiconductor chip;

a first heat conduction surface that contributes to heat conduction between the first semiconductor chip and the first heat sink is smaller in an area than a second heat conduction surface that contributes to heat conduction between the second semiconductor chip and the second heat sink; and a first region of the cooler where the first semiconductor component is disposed has higher cooling performance than a second region of the cooler where the second semiconductor component is disposed, wherein a switching speed of the first switch element is equal to or lower than a switching speed of the second switch element.

18. A power module comprising:

a cooler; and a semiconductor module having a first semiconductor component and a second semiconductor component disposed in the cooler, wherein:

the first semiconductor component includes a first semiconductor chip on which a first switch element is arranged, and a first heat sink on which the first semiconductor chip is arranged;

the second semiconductor component includes a second semiconductor chip on which a second switch element is arranged, and a second heat sink on which the second semiconductor chip is arranged;

the first semiconductor chip is smaller in size than the second semiconductor chip;

a first heat conduction surface that contributes to heat conduction between the first semiconductor chip and the first heat sink is smaller in an area than a second heat conduction surface that contributes to heat conduction between the second semiconductor chip and the second heat sink; and a first region of the cooler where the first semiconductor component is disposed has higher cooling performance than a second region of the cooler where the second semiconductor component is disposed, wherein:

the first semiconductor component has a first free wheel diode connected in parallel with the first switch element and disposed on the first semiconductor chip together with the first switch element; and the second semiconductor component has a second free wheel diode connected in parallel with the second switch element and disposed on the second semiconductor chip together with the second switch element.

* * * * *